(12) United States Patent
Oh et al.

(10) Patent No.: US 8,633,742 B2
(45) Date of Patent: Jan. 21, 2014

(54) CIRCUIT AND METHOD FOR GENERATING POWER-UP SIGNAL

(75) Inventors: Sang-Mook Oh, Gyeonggi-do (KR); Jae-Hyuk Im, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 655 days.

(21) Appl. No.: 12/881,471

(22) Filed: Sep. 14, 2010

(65) Prior Publication Data

US 2012/0007573 A1 Jan. 12, 2012

(30) Foreign Application Priority Data

Jul. 6, 2010 (KR) .................. 10-2010-0064998

(51) Int. Cl.
*H03L 7/00* (2006.01)
(52) U.S. Cl.
USPC ........................................... 327/143
(58) Field of Classification Search
None
See application file for complete search history.

(56) References Cited

U.S. PATENT DOCUMENTS

2004/0070430 A1* 4/2004 La Rosa .................. 327/143

FOREIGN PATENT DOCUMENTS

| KR | 1020050068332 | 7/2005 |
| KR | 100780639 | 11/2007 |

OTHER PUBLICATIONS

Notice of Preliminary Rejection issued from Korean Intellectual Property Office on Aug. 30, 2011.

* cited by examiner

*Primary Examiner* — Daniel Rojas
(74) *Attorney, Agent, or Firm* — IP & T Group LLP

(57) ABSTRACT

A power-up signal generation circuit includes a power-up signal generator configured to enable a power-up signal when a level of an external power voltage is higher than a target level, and a target level controller configured to change the target level in response to a current consumption signal indicating a current consumption of a system including the power-up signal generation circuit.

14 Claims, 5 Drawing Sheets

CIRCUIT AND METHOD FOR GENERATING POWER-UP SIGNAL

CROSS-REFERENCE TO RELATED APPLICATIONS

The present application claims priority of Korean Patent Application No. 10-2010-0064998, filed on Jul. 6, 2010, which is incorporated herein by reference in its entirety.

BACKGROUND OF THE INVENTION

Exemplary embodiments of the present invention relate to a circuit and method for generating a power-up signal for initializing a semiconductor device.

Semiconductor devices, such as Dynamic Random Access Memory (DRAM), generally include a power-up signal generation circuit to secure stable operation of an internal circuit. When an is external power voltage VDD is inputted into a semiconductor device, the external power voltage VDD gradually increases to a target level. If the external power voltage VDD below the target level is supplied to a semiconductor internal circuit, a latch-up phenomenon may occur and the semiconductor device may be damaged. To prevent this phenomenon from occurring, a power-up signal generation circuit is implemented with the semiconductor device. The power-up signal generation circuit enables a power-up signal when the external power voltage VDD reaches the target level in order to stably operate the internal circuit and initialize the semiconductor device.

FIG. 1 is a schematic diagram illustrating a conventional power-up signal generation circuit, and FIG. 2 shows waveforms of an external power voltage VDD and a power-up signal PWRUP in the power-up signal generation circuit of FIG. 1.

The external power voltage VDD supplied to the power-up signal generation circuit is divided through resistors R11 and R12. The divided voltage is the voltage at a dividing node DIV. The divided voltage has a characteristic that it linearly varies according to the external power voltage VDD.

An NMOS transistor N11 receives the divided voltage as a gate input and is turned on more strongly as the level of the external power voltage VDD becomes higher. As the NMOS transistor N11 is turned on more strongly, a detection voltage becomes lower gradually. The detection voltage is the voltage at a detection node DET. When the detection voltage is lower than a certain level, that is, when the external power voltage VDD becomes higher than a target level V1, an inverter enables a power-up signal PWRUP.

Referring to FIG. 2, variation of the power-up signal PWRUP based on the variation of the external power voltage VDD is described herein, along with the concerns of the conventional technology for the power-up signal PWRUP.

In a duration prior to t1, the external power voltage VDD, which is applied to a circuit to turn on the power of a semiconductor device, is gradually increased. However, since the external power voltage VDD has not yet reached the target level V1, the power-up signal PWRUP is in a disabled state.

In a duration between t1 and t2, the external power voltage VDD is increased higher than the target level V1. The NMOS transistor N11 is turned on enough to enable the power-up signal PWRUP and the power-up signal PWRUP transitions to the same level as the external power voltage VDD.

In a duration between t2 and t3, the current consumption amount of the semiconductor device is increased and the external power voltage VDD drops. For example, when a DRAM performs an active operation ACT, such voltage drop may occur. In this case, when the external power voltage VDD drops lower than the target level V1, the detection voltage may be raised. When the detection voltage is raised and then drops, the power-up signal PWRUP is reset RESET and accordingly the semiconductor device in the middle of an operation may be inadvertently initialized again.

SUMMARY OF THE INVENTION

Exemplary embodiments of the present invention, which are devised to address the concerns of the conventional technology, are directed to a power-up signal generation circuit and a power-up signal generation method.

In accordance with an exemplary embodiment of the present invention, a power-up signal generation circuit includes a power-up signal generator configured to enable a power-up signal when a level of an external power voltage is higher than a target level, and a target level controller configured to change the target level in response to a current consumption signal indicating a current consumption of a system including the power-up signal generation circuit.

In accordance with another exemplary embodiment of the present invention, a method for generating a power-up signal includes enabling a power-up signal when a level of an external power voltage is higher than a target level, and changing the target level in response to a current consumption signal, which is enabled when a system, initialized by the power-up signal, consumes a certain amount of current.

BRIEF DESCRIPTION OP THE DRAWINGS

DESCRIPTION OF SPECIFIC EMBODIMENTS

Figure 1:
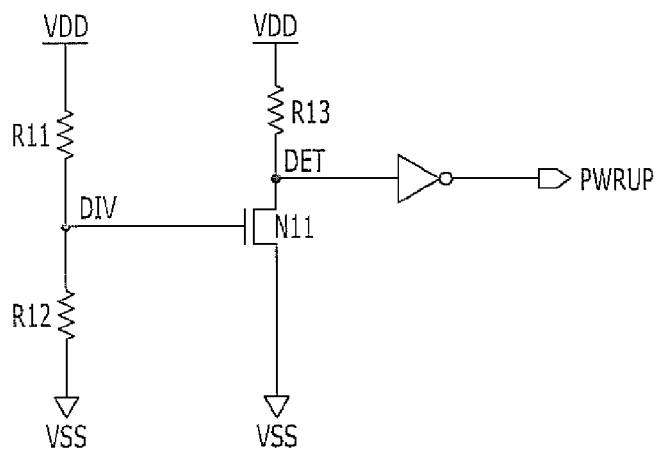
FIG. 1 is a schematic diagram illustrating a conventional power-up signal generation circuit.
Figure 2:
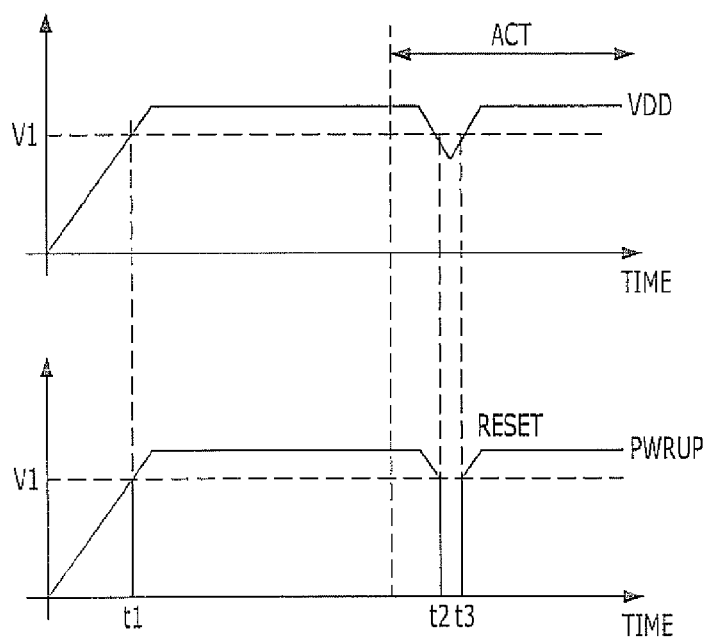
FIG. 2 shows waveforms of an external power voltage VDD and a power-up signal PWRUP in the power-up signal generation circuit of FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
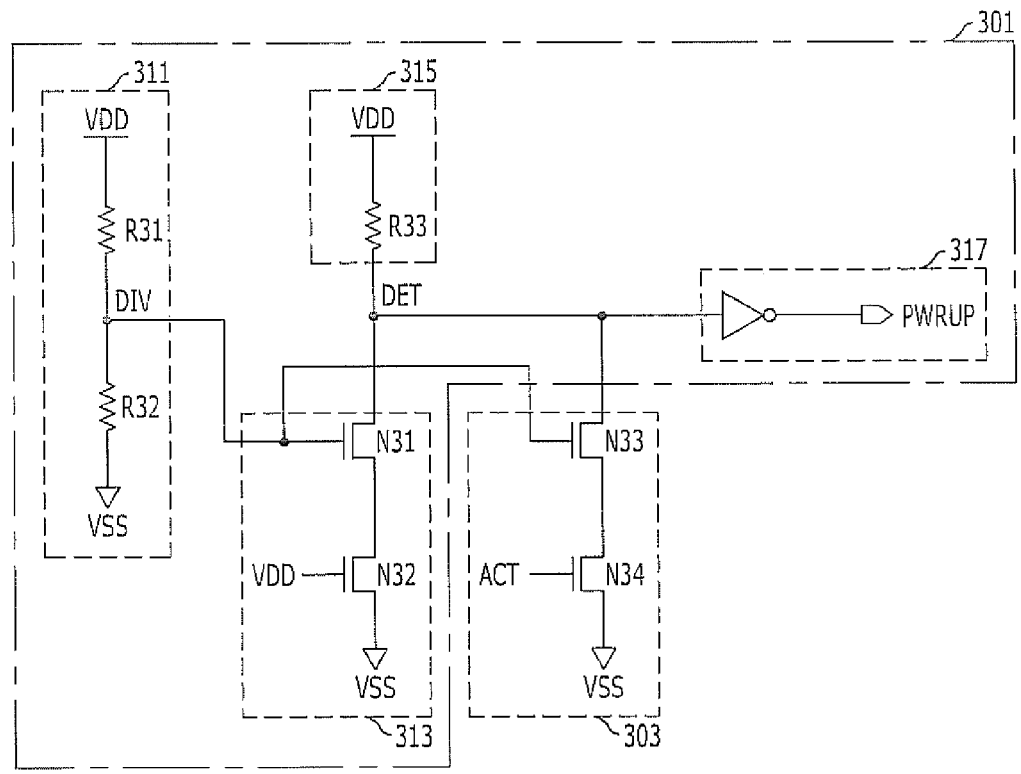
FIG. 3 is a schematic illustrating a power-up signal generation circuit in accordance with an exemplary embodiment of the present invention.
Figure 4:
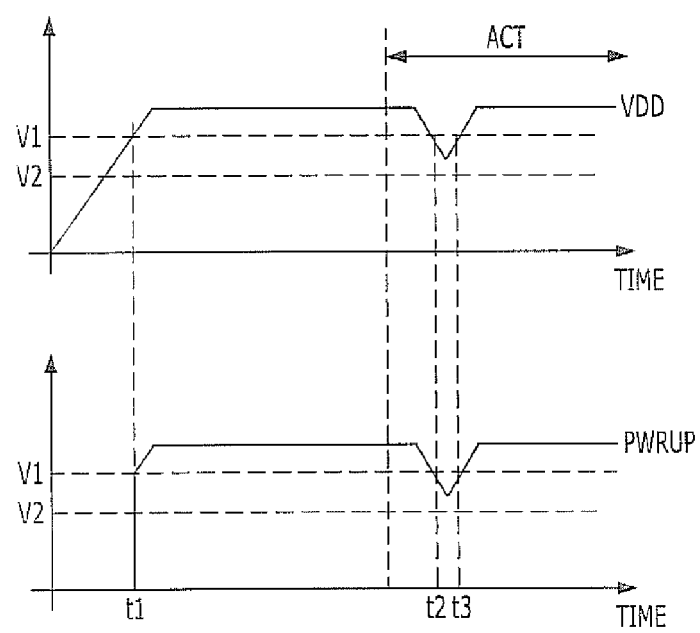
FIG. 4 shows waveforms of an external power voltage VDD and a power-up signal PWRUP in the power-up signal generation circuit of FIG. 3.

FIG. 3 is a schematic illustrating a power-up signal generation circuit in accordance with an exemplary embodiment of the present invention, and FIG. 4 shows waveforms of an external power voltage VDD and a power-up signal PWRUP in the power-up signal generation circuit of FIG. 3.

Referring to FIG. 3, the power-up signal generation circuit includes a power-up signal generator 301 and a target level controller 303. The power-up signal generator 301 enables a power-up signal PWRUP when the level of the external power voltage VDD is higher than the target level. The target level controller 303 changes the target level in response to a current consumption signal which is enabled when a system including the power-up signal generation circuit consumes a relatively large amount of current.

Herein, the system including the power-up signal generation circuit may be a semiconductor memory device, and the period of time in which the system including the power-up signal generation circuit consumes much of the current may be an active operation period of the memory device. The current consumption signal enabled in the active operation period may be an active signal ACT.

The target level controller 303 prevents the power-up signal PWRUP from being reset by decreasing the target level of the external power voltage VDD, which generates the power-up signal PWRUP, when the power consumption signal, that is, the active signal ACT, is enabled. In most cases, the external power voltage VDD may drop in a semiconductor memory device during an active operation, where the memory momentarily consumes a great deal of current. Therefore, as soon as the active operation begins, an active signal ACT, indicating the beginning of the active operation, is transferred to the target level controller 303, and the target level controller 303 lowers the target level in order to maintain an active state of the power-up signal PWRUP in response to the active signal ACT. Accordingly, the power-up signal PWRUP is not reset even if the external power voltage VDD drops.

The power-up signal generator 301 may include a voltage dividing unit 311, a pull-down driving unit 313, a pull-up driving unit 315, and a signal output unit 317.

The voltage dividing unit 311 divides the external power voltage VDD into a divided voltage, and includes a first resistor R31 and a second resistor R32 serially coupled between an external power voltage VDD terminal and a ground voltage VSS terminal. Herein, the divided voltage refers to a voltage at a dividing node DIV and it is a function of the external power voltage VDD and a resistance ratio (R2/(R1+R2)) of the voltage dividing unit 311.

The pull-down driving unit 313 may include a first transistor N31 which receives the generated divided voltage as a gate input and becomes more strongly turned on as the divided voltage increases, and a second transistor N32 which receives the external power voltage VDD as a gate input and functions as a resistor. Herein, as the first transistor N31 is turned on more strongly, a detection voltage becomes lower, and when the external power voltage VDD exceeds the target level V1, the power-up signal PWRUP is enabled. Herein, the detection voltage is a voltage at a detection node DET.

The pull-up driving unit 315 includes a third resistor R33 coupled to the external power voltage VDD. Since the first transistor N31 becomes turned on more strongly as the external power voltage VDD increases, more current may flow and a greater voltage drop may occur across the third resistor R33. As a result, the detection node DET is pulled-down and the detection voltage becomes a low logic level.

The signal output unit 317 outputs the power-up signal PWRUP when the detection voltage drops below a certain level. Accordingly, the outputted power-up signal PWRUP maintains the same voltage level as the external power voltage VDD.

The target level controller 303 may be formed to include a third transistor N33 and a fourth transistor N34 serially coupled with each other. When the active signal ACT is enabled, the detection node DET is pulled-down to decrease the detection voltage. The third transistor N33 receives the divided voltage as a gate input. Meanwhile, the fourth transistor N34 receives the active signal ACT as a gate input and it is turned on when the received active signal ACT is enabled.

FIG. 4 shows the effect of the technology of the present invention. In the power-up signal generation circuit shown in FIG. 3, since the fourth transistor N34 makes more current flow into the third resistor R33 of the pull-up driving unit 315 when the active signal ACT is enabled, the detection voltage is decreased. In short, there is an effect that the target level may be decreased from V1 to V2. In this case, although the external power voltage VDD drops below the target level V1, the fourth transistor N34 maintains the state in which it is strongly turned on. Thus, the detection voltage is prevented from increasing up to a level that the power-up signal PWRUP is disabled, and therefore, the power-up signal PWRUP is prevented from being reset. When the active signal ACT is disabled, the target level maintains the level of V1.

FIGS. 5A to 5D are schematics illustrating a power-up signal generation circuit in accordance with other exemplary embodiments of the present invention.

In the circuits shown in FIGS. 5A to 5D, a target level controller 503 may decrease the target level of an external power voltage VDD by controlling a resistance ratio of a voltage dividing unit 501 when an active signal ACT is enabled.

Figure 5A:
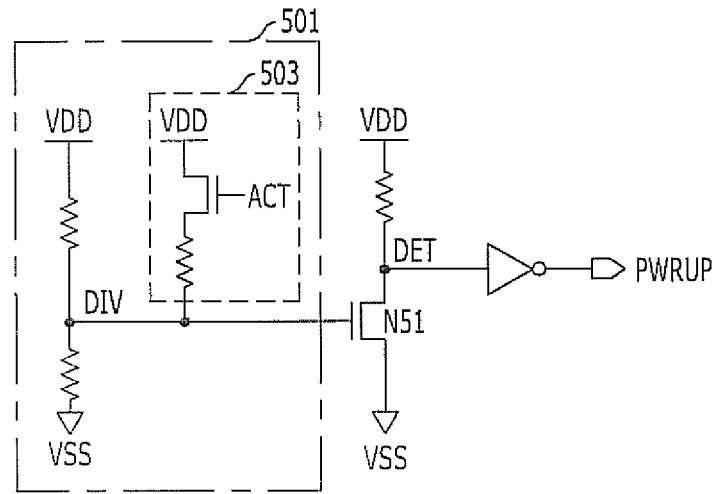
FIGS. 5A to 5D are schematics illustrating a power-up signal generation circuit in accordance with other exemplary embodiments of the present invention.
Figure 5B:
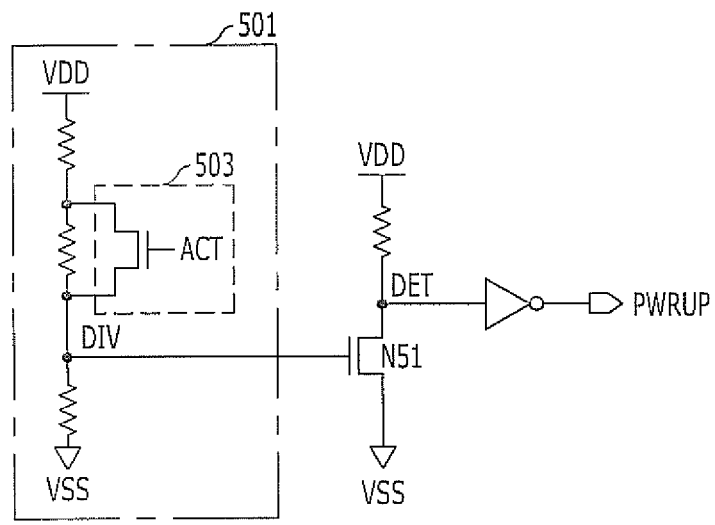

In case of the circuits shown in FIGS. 5A and 5B, when the active signal ACT is enabled, the resistance value between the external power voltage VDD and the dividing node DIV decreases, the divided voltage increases and a transistor N51 is more strongly turned on. Therefore, although the external power voltage VDD drops by a certain degree, the power-up signal PWRUP is not reset.

Figure 5C:
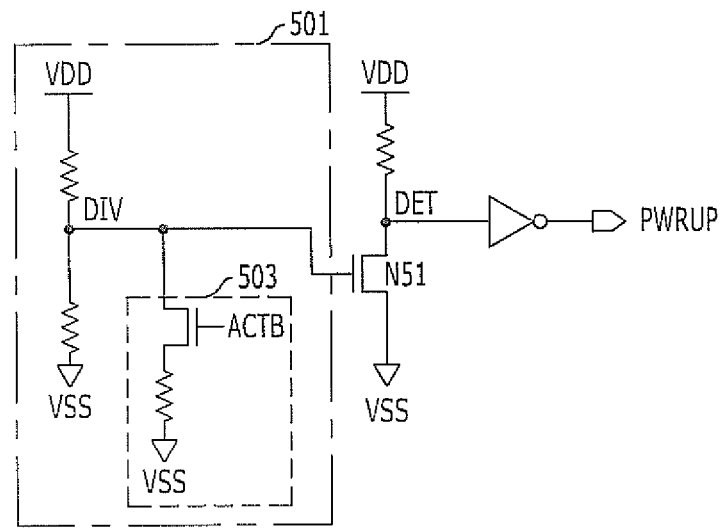
Figure 5D:
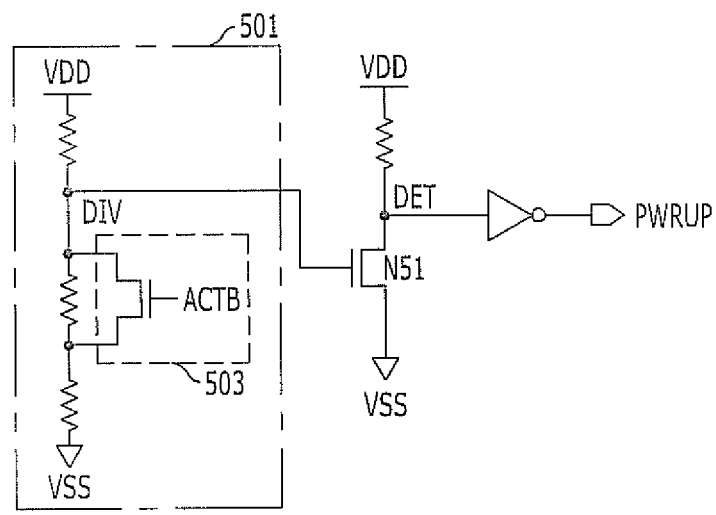

The circuits shown in FIGS. 5C and 5D include a target level controller 503 using a transistor with an active bar signal ACTB, which is an inverted active signal, as a gate input. Herein, the active bar signal ACTB may be disabled in an active period and enabled at other times. As described above, even though the external power voltage VDD drops by a certain degree, it is possible to prevent the power-up signal PWRUP from being reset by increasing the resistance value between the ground voltage VSS and the dividing node DIV in the active period so as to increase the divided voltage.

In other words, in all circuits of FIGS. 5A to 5D, when the active signal ACT is enabled, the ratio of a resistance value between the ground voltage VSS and the dividing node DIV and a resistance value between the external power supply voltage VDD and the dividing node DIV is increased in the voltage dividing unit 501. Accordingly, the level of the divided voltage is relatively increased. Therefore, although the external power voltage VDD drops by a certain degree, since the transistor N51 maintains the state of strong turn-on, the target level is decreased.

Figure 6A:
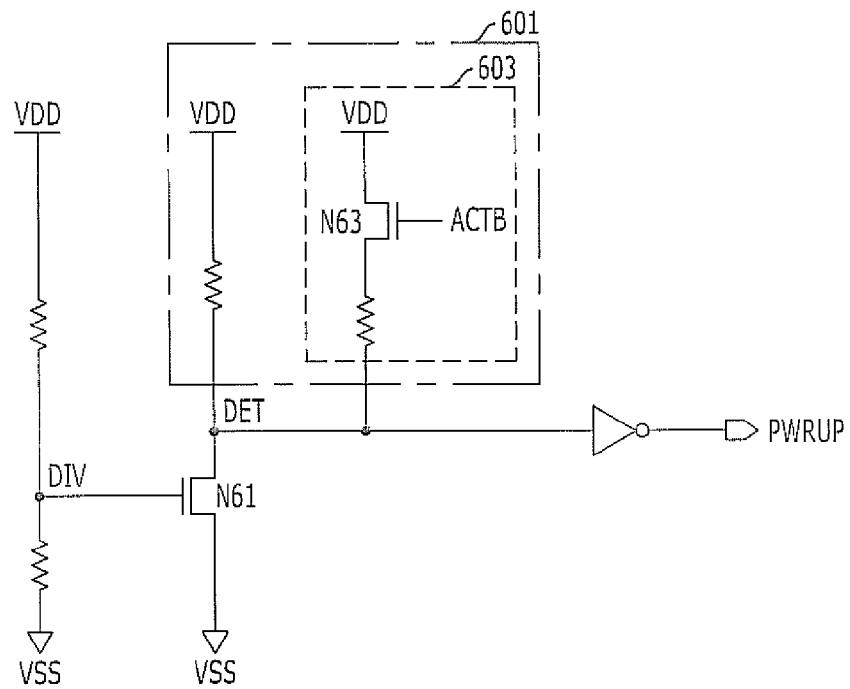
FIGS. 6A and 6B are schematics illustrating a power-up signal generation circuit in accordance with other exemplary embodiments of the present invention.
Figure 6B:
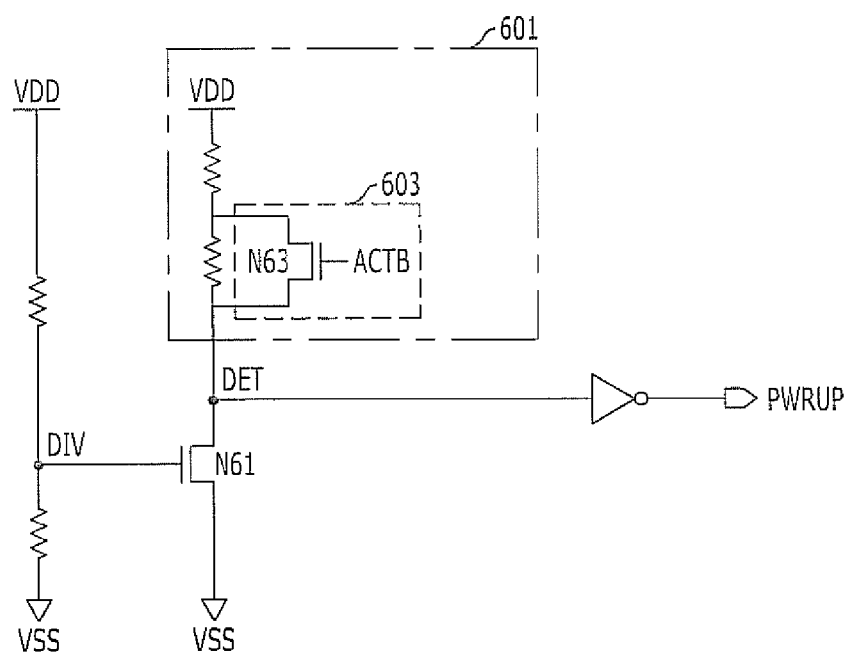

FIGS. 6A and 6B are schematics illustrating a power-up signal generation circuit in accordance with other exemplary embodiments of the present invention.

In the circuits shown in FIGS. 6A and 6B, a target level controller 603 decreases the target level of an external power voltage VDD by controlling a resistance ratio of a pull-up dividing unit 601. As the total resistance value between the external power voltage VDD and a detection node DET becomes greater, a detection voltage may be decreased. The resistance value between the external power voltage VDD and the detection node DET is made to be greater in an active period. Therefore, it is possible to decrease a target level by using a transistor N63 which receives an active bar signal ACTB, which is an inverted active signal, in the target level controller 603.

According to the technology of the present invention, described above, although an external power voltage drops, a power-up signal may be prevented from being reset by using a signal enabled in a period where a relatively large amount of current is consumed in a semiconductor device, e.g., an active period, and changing the target level of the external power voltage.

While the present invention has been described with respect to the specific embodiments, it will be apparent to those skilled in the art that various changes and modifications may be made without departing from the spirit and scope of the invention as defined in the following claims.

What is claimed is:

1. A power-up signal generation circuit, comprising:
   a power-up signal generator configured to enable a power-up signal when a level of an external power voltage is higher than a target level of the external power voltage; and
   a target level controller configured to change the target level of the external power voltage in response to a current consumption signal indicating a current consumption of a system including the power-up signal generation circuit.

2. The power-up signal generation circuit of claim 1, wherein the target level controller decreases the target level when the current consumption signal is enabled.

3. The power-up signal generation circuit of claim 1, wherein the system includes a memory device, and the current consumption signal is an active signal.

4. The power-up signal generation circuit of claim 1, wherein the power-up signal generator comprises:
   a voltage dividing unit configured to generate a divided voltage by dividing the external power voltage;
   a pull-down driving unit configured to pull-down drive a detection node in response to the divided voltage;
   a pull-up driving unit configured to pull-up drive the detection node; and
   a signal output unit configured to enable the power-up signal when a voltage of the detection node is lower than a certain value.

5. The power-up signal generation circuit of claim 4, wherein the target level controller pull-down drives the detection node in response to the current consumption signal.

6. The power-up signal generation circuit of claim 4, wherein the target level controller controls a resistance value of the voltage dividing unit in response to the current consumption signal.

7. The power-up signal generation circuit of claim 4, wherein the target level controller controls a resistance value of the pull-up driving unit in response to the current consumption signal.

8. The power-up signal generation circuit of claim 1, wherein the current consumption signal is enabled in a period when the system consumes a current greater than a certain amount.

9. The power-up signal generation circuit of claim 1, wherein the power-up signal generator includes a voltage dividing unit dividing the external power voltage, and the target level controller controls a resistance value of the voltage dividing unit in response to the current consumption signal.

10. The power-up signal generation circuit of claim 1, wherein the power-up signal generator includes a driving unit driving a detection node of the external power voltage to enable a power-up signal, and the target level controller controls a driving of the detection node in response to the current consumption signal.

11. A method for generating a power-up signal, comprising:
    enabling a power-up signal when a level of an external power voltage is higher than a target level of the external power voltage; and
    changing the target level of the external power voltage in response to a current consumption signal, which is enabled when a system, initialized by the power-up signal, consumes a certain amount of current.

12. The method of claim 11, wherein the changing of the target level comprises:
    decreasing the target level when the current consumption signal is enabled.

13. The method of claim 11, wherein the system includes a memory device, and the current consumption signal is an active signal.

14. The method of claim 11, wherein the certain amount of current is an amount that causes the external power voltage to drop below the target level.

* * * * *